United States Patent [19]  [11] 4,150,310
Emile, Jr.  [45] Apr. 17, 1979

[54] TRACK AND HOLD CIRCUIT
[75] Inventor: Philip Emile, Jr., Roseland, N.J.
[73] Assignee: Sangamo Weston, Inc., Atlanta, Ga.
[21] Appl. No.: 871,278
[22] Filed: Jan. 23, 1978
[51] Int. Cl.$^2$ .................. G11C 27/02; H03K 5/153; H03K 5/18
[52] U.S. Cl. .................. 307/353; 307/234; 328/111; 328/151
[58] Field of Search ............... 307/234, 353; 328/111, 328/112, 114, 132, 151

[56] References Cited
U.S. PATENT DOCUMENTS
3,875,516  4/1975  Thomas ..................... 328/114 X Primary Examiner—John Zazworsky
Attorney, Agent, or Firm—W. R. Sherman; Kevin McMahon; Edward Manzo

[57] ABSTRACT

A track and hold system for use with a test instrument such as a multimeter includes an input circuit, a buffer amplifier, a storage device such as a capacitor, an output amplifier, an output circuit, a detector for detecting a pulse on a signal passing from the input to the output, and a switch responsive to the detector for isolating the storage device from the input circuit but not the output circuit for a predetermined period. The system also includes a timer responsive to the detector to provide an isolation command to the switch for the predetermined period. Further, the system includes a delay circuit, responsive to the detector, for interposing a delay of variable duration prior to activating the timer. In a preferred embodiment, where the system is used in conjunction with a multimeter having a "hold" circuit which directs the meter to display the last-measured signal, an output is provided to the hold input of the meter directing the meter to "hold" for predetermined periods whenever the switch opens or closes. The "hold" output circuit is also used to provide indefinite retention of a reading and trigger lockout for the detector circuitry.

16 Claims, 4 Drawing Figures

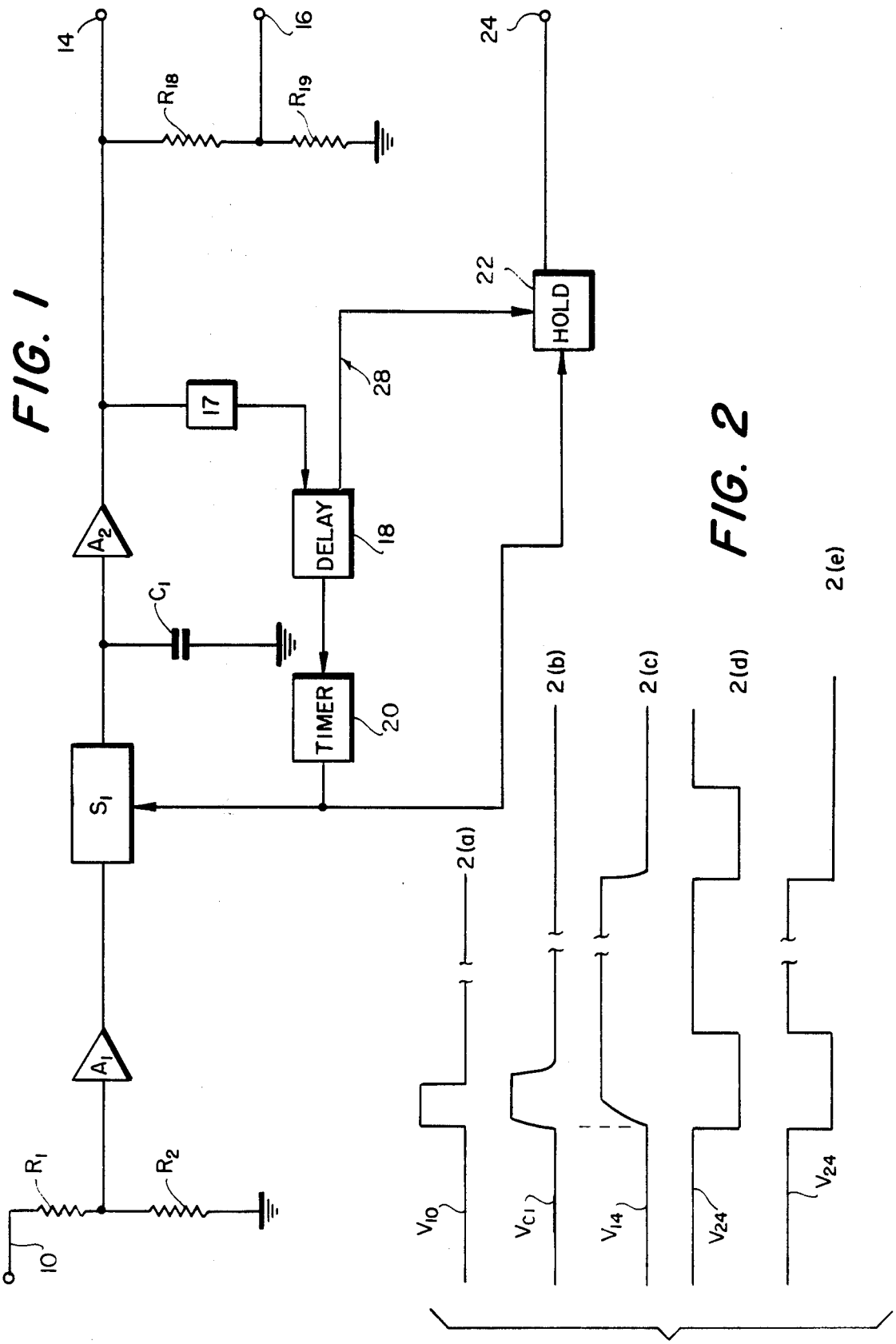

TRACK AND HOLD CIRCUIT

BACKGROUND OF THE INVENTION

The present invention is a track and hold circuit for use in conjunction with electrical measuring equipment, such as multimeters.

A wide variety of electronic equipment in use today uses or generates pulses to activate or deactivate other circuitry or mechanisms. In many cases, it is important that the pulse have certain characteristics, such as a particular amplitude and width. In the field, service personnel have generally tested for the presence of such pulses by looking on an analog meter for a "tick" in the measured quantity (a slight dip or rise on the pointer). Such a technique is unreliable and inaccurate, and gives no information about pulse characteristics. Without an oscilloscope or other expensive and bulky instrument, the characteristics of the pulse remain essentially unkown.

Accordingly, the principal object of the present invention is to provide a device to adapt a multimeter to measure pulse profile.

It is a further object to provide a track and hold capability at minimum power consumption so that essentially shelf-life of an ordinary 9V battery will be achieved, i.e. current <0.1 milliamper.

SUMMARY OF THE INVENTION

These and other objects are achieved by providing an input circuit for receiving an input signal, a storage device connected to the input circuit for storing a signal corresponding to the instantaneous value of the amplitude of a pulse applied to the input circuit, an output circuit receiving the output of the storage device, a pulse detector for detecting a pulse, and a switching circuit connected to the pulse detector to isolate the storage device from the input so that the output signal represents the amplitude of the pulse. In the preferred embodiment the pulse detector is connected to monitor the output circuit. The preferred embodiment also includes a delay circuit for interposing a delay of selectable duration prior to activating the switching circuit and means for selecting the duration of such delay. When a delay of zero duration is selected, the signal on the storage device corresponds to the initial pulse amplitude. When a delay of larger duration is selected, the signal corresponding to initial pulse amplitude will have passed from the storage device to the output circuit when the switching circuit is activated; the signal on the storage device when the switching circuit is activated corresponds to the pulse amplitude at the selected delay time after the leading edge. Hence, the pulse amplitude at any position from the leading edge forward can be isolated so that the entire pulse profile may be measured.

BRIEF DESCRIPTION OF THE DRAWINGS

Other objects, features and advantages of the present invention will be more apparent from the following description which refers to the accompanying drawings, wherein:

FIG. 1 is a block diagram showing the major operating components of the track and hold system according to the present invention;

FIG. 2 are timing diagrams of various representative signals occurring in the apparatus of FIG. 1.

DESCRIPTION OF A PREFERRED EMBODIMENT

Figures 3A, 3B:
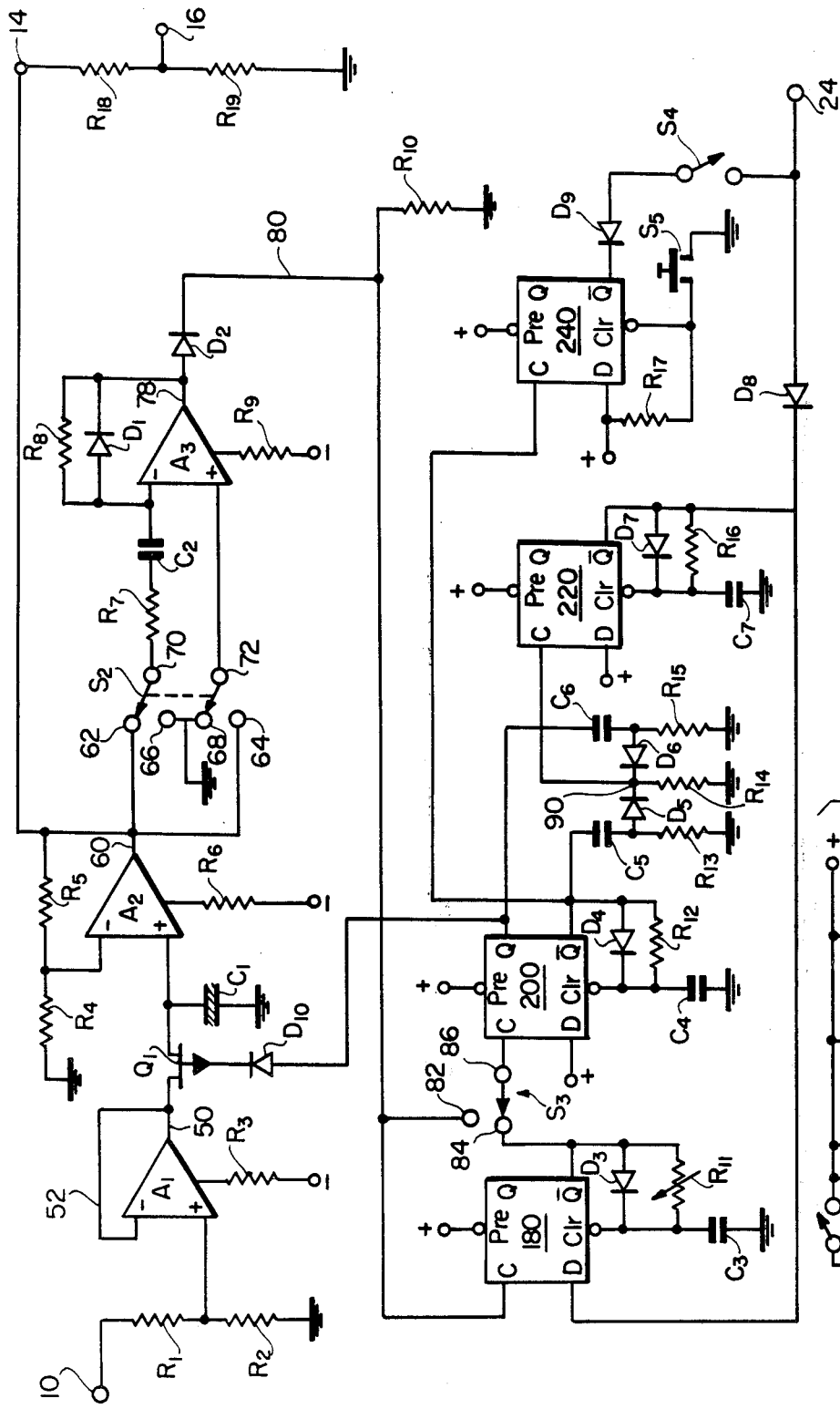
FIG. 3(a) is a more detailed circuit diagram of the apparatus shown in FIG. 1, further including a bypass switch to bypass the delay circuit 18 shown in FIG. 1
FIG. 3(b) is a circuit diagram of a power supply of FIG. 3(a).

Referring to FIG. 1, an input terminal 10 receives an unknown analog signal and applies such signal through the voltage divider formed by resistors $R_1$ and $R_2$ to the input of buffer amplifier $A_1$. The output of amplifier $A_1$ is applied through a normally closed switch $S_1$ to a first side of capacitor $C_1$, the second side of which is grounded. Capacitor $C_1$ is driven by the low impedance of $A_1$ so that the voltage across it follows the output of amplifier $A_1$. A slight lag is minimized by selecting an appropriate value for capacitor $C_1$. The first side of capacitor $C_1$ is connected to the input of output amplifier $A_2$, the output of which is applied to output terminal 14. An attenuated output is taken from the junction of the voltage divider formed by resistors $R_{18}$ and $R_{19}$ and applied to output terminal 16.

A pulse detecting circuit 17 is connected to the output of amplifier $A_2$. Pulse detection circuit 17 detects voltage rises which have a preselected rate of increase appearing at the output of amplifier $A_2$ and provides a trigger signal coincident with the leading edge of such a pulse. The trigger signal is applied to a delay circuit 18 which provides a delay of selectable duration after which it applies a signal to timer 20. In response thereto, timer 20 generates an output for a predetermined period which opens switch $S_1$. Switch $S_1$ thereby isolates capacitor $C_1$ from the signal applied to input terminal 10. In this mode, the system provides an essentially constant amplitude output at output 14 corresponding to the last value of the analog input stored in capacitor $C_1$. This mode is of sufficient duration so that a test instrument such as a multimeter can measure the initial amplitude of a pulse detected by the track and hold system. By varying the delay of circuit 18, the entire pulse profile may be measured, as set forth above.

Certain test instruments such as the WESTON® DMM 6000 are provided with a "hold" mechanism or input whereby the multimeter will hold the readout of the unknown measured immediately prior to the hold command. The "hold" signal can be used to prevent incorrect, partial amplitude readings being displayed by the multimeter. The preferred embodiment of the present invention provides such a hold command to the input terminal of the test instrument. Hold circuit 22 receives an input from timer 20 and applies a hold command for a predetermined period, illustratively 200 milliseconds, to hold output 24 which, in use, is connected to the hold input of the associated meter. Additionally, hold circuit 22 includes an autohold facility which is described below.

The operation of the circuit is best understood by refering to FIGS. 1 and 2. As shown in FIG 2(a), a signal is applied to input terminal 10 of the track and hold system. The baseline signal may be a DC voltage or a slowly varying AC voltage, or a combination thereof. This signal is applied to output terminal 14 while the system tracks the applied input signal. A pulse as shown in FIG. 2(a) appears on Capacitor $C_1$ as shown in FIG. 2(b). When the leading edge of that pulse on capacitor $C_1$ is encountered by the pulse detecting circuit 17, a trigger signal in response thereto is applied to delay circuit 18. Initially, the delay circuit 18 is set to interpose no delay, and accordingly, timer 20 is activated as soon as the leading edge of the pulse is detected. (In the more detailed circuit diagram of FIG. 3, the trigger signal is selectively applied by a switch to either delay 18 or timer 20.) In response to the trigger signal, timer 20 opens switch $S_1$ for a preselected period, for instance 1500 millliseconds. Accordingly, the voltage at output terminal 14 as shown in FIG. 2(c) corresponds to the initial pulse amplitude, since a voltage representative thereof remains on capacitor $C_1$. This output endures for 1500 milliseconds, providing a sufficient time for a meter to take a measurement.

Simultaneously with the opening of switch $S_1$, timer 20 applies a signal to hold circuit 22 which applies a hold command to hold output 24 for a period illustratively of 200 milliseconds as shown in FIG. 2(d). Output 24 is normally held at a voltage of one or two volts, and is dropped to zero volts for the hold signal. A second hold command is applied to hold output 24 by hold circuit 22 when switch $S_1$ is closed at the end of the 1500 millisecond period. The hold signal applied by hold circuit 22 to output 24 directs the associated meter to retain the previously measured quantity on its display (while continuing to measure new unknowns). Otherwise a voltage intermediate the baseline and maximum of $V_{14}$ (FIG. 2(c)), i.e., a voltage on the leading or trailing ramp, might be displayed. Such hold commands therefore ensure that the associated masuring instrument has a full measurement cycle for sensing or integrating the applied unknown and that intermediate voltages are not displayed.

Additionally, the preferred embodiment of the present invention includes an autohold facility of hold circuit 22 which applies a hold command of 200 milliseconds, illustratively, at the beginning of the 1500 millisecond switch opening and an openend hold command as shown in FIG. 2(e) when the switch $S_1$ is closed. This allows a user of the meter to reset or release the meter hold manually, which is particularly useful when the user is not in a position to read the meter at once.

The track and hold circuit according to the invention cooperates with a measuring instrument to determine the pulse amplitude at any desired point on a pulse and its pulse width by selecting the delay time of delay circuit 18. The delay period is measured after the pulse leading edge, so that the voltage on capacitor $C_1$ after the switch $S_1$ opens corresponds to pulse amplitude at any time of interest. As the delay is increased gradually from zero, the meter continues to measure pulse amplitude. Ultimately, the duration of the delay will be set at a time period which exceeds the duration of the pulse applied to input 10. At such time, the meter will register zero or the baseline voltage. The pulse width can be determined by observing the minimum delay time which exceeds the pulse duration. Accordingly, the entire pulse profile may be determined.

A further feature of the preferred embodiment track and hold circuit of the present invention is an "inhibit" connection 28 between hold circuit 22 and delay circuit 18. This connection is particularly useful when pulse width measurements are being taken on one of a train of pulses. Absent such an "inhibit" connection, inaccurate readings may be made. For example, when one pulse is detected, switch $S_1$ is opened illustratively for 1500 milliseconds in response thereto. When switch $S_1$ closes, an intermediate pulse characteristic of a subsequent pulse may be falsely interpreted by pulse detection circuit 17 as the start of a new pulse rather than an intermediate characteristic. Accordingly, an "inhibit" signal of 200 milliseconds is provided when switch $S_1$ closes to disable delay circuit 18, so that no new opening of switch $S_1$ can occur immediately.

As shown in the more detailed circuit diagram of FIG. 3(a), an input applied to input terminal 10 is connected through a voltage divider formed by series resistors $R_1$ and $R_2$ to the non-inverting input of buffer amplifier $A_1$, a standard type 776 operational amplifier made by Fairchild Semiconductor, for example. The output 50 of amplifier $A_1$ is fed back to its inverting input by conductor 52 to provide a unity voltage gain characteristic.

The output 50 of amplifier $A_1$ is applied to the source of field effect transistor $Q_1$, which constitutes switch $S_1$ of FIG. 1. The drain of FET $Q_1$ is connected to one side of a non-polar capacitor $C_1$. The other side of capacitor $C_1$ is grounded.

The ungrounded side of capacitor $C_1$ is connected also to the non-inverting input of amplifier $A_2$, also a 776 type operational amplifier. The output 60 of amplifier $A_2$ is fed back to its inverting input through the voltage divider formed by resistors $R_4$ and $R_5$, with resistor $R_5$ connected between output 60 of amplifier $A_2$ and the inverting input, and $R_4$ connected between the inverting input and ground. The output 60 of amplifier $A_2$ is connected to output terminal 14. Output 60 is connected also to both the upper contact 62 of a first side of a double-pole double-throw polarity switch $S_2$ and to the lower contact 64 of the second side of $S_2$. Both the lower contact 66 of the first side and the upper contact 68 of the second side of switch $S_2$ are connected to ground. The blade 70 of the first side of $S_2$ is connected through resistor $R_7$ and series capacitor $C_2$ to the inverting input of trigger amplifier $A_3$, illustratively a 776 type operational amplifier. The blade 72 of the second side of $S_2$ is connected to the non-inverting input of trigger amplifier $A_3$. The output 78 of amplifier $A_3$ is fed back to its inverting input through resistor $R_8$ which is connected parallel to diode $D_1$, the cathode of which is connected to output 78 and the anode of which is connected to the inverting input.

The output 78 of amplifier $A_3$ is connected to the anode of diode $D_2$, the cathode of which is connected by conductor 80 to the clock input C of a D-type flip-flop 180, illustratively one-half of a National Semiconductor 74C74. Resistor $R_{10}$ is connected between the cathode of diode $D_2$ and ground. The Q output of flip-flop 180 is connected to the anode of diode $D_3$, the cathode of which is applied to the "clear" input "Clr" of flip-flop 180. Variable resistor $R_{11}$ is connected parallel to $D_3$. In the preferred embodiment, resistor $R_{11}$ is a potentiometer having its shaft extending out of the casing of the track and hold system. Surrounding the shaft and on the casing is a scale calibrated in milliseconds. A suitable pointer-knob is affixed to the potentiometer so that the scale is correlated to the value of resistance $R_{11}$ and, therefore, as explained below, the delay time interposed by the delay circuit using flip-flop 180. The clear input is connected to one side of capacitor $C_3$, the other side of which is connected to ground.

Circuit 80 is connected to one contact 82 of single-pole double-throw by-pass switch $S_3$. The $\overline{Q}$ output of flip-flop 180 is connected to the second contact 84 of switch $S_3$. The blade 86 of switch $S_3$ is connected to the clock input C of flip-flop 200, also a D-type and, conveniently, the second half of the 74C74.

Hence, switch $S_3$ operates as a selector or by-pass switch, either to connect flip-flop 180 to or isolate flip-flop 180 from flip-flop 200. Flip-flop 180 and its associated components constitute the delay circuit 18 of FIG. 1. As mentioned above, delay circuit 18 may be bypassed when only initial pulse amplitude measurement is desired.

Both the data input "D" and the preset input "Pre" of flip-flop 200 are connected to a positive output provided by power supply 500. The $\overline{Q}$ output of flip-flop 200 is connected to the anode of diode $D_4$, the cathode of which is connected to the clear input "Clr" of flip-flop 200. Resistor $R_{12}$ is connected parallel to $D_4$. The clear input "Clr" is connected also to one side of a capacitor $C_4$, the other side of which is grounded. The Q output of flip-flop 200 is connected to capacitor $C_5$. The other side of $C_5$ is connected through resistor $R_{13}$ to ground. The junction of $C_5$ and $R_{13}$ is connected to the anode of diode $D_5$, the cathode of which is connected to a point 90. Point 90 is connected through resistor $R_{14}$ to ground.

Similarly, the Q output of flip-flop 200 is connected to capacitor $C_6$, the other side of which is connected through resistor $R_{15}$ to ground. The junction of $C_6$ and $R_{15}$ is connected to the anode of diode $D_6$, the cathode of which is connected to point 90.

Point 90 is connected to the clock input "C" of the "hold" flip-flop 220, the data input "D" and the preset input "Pre" of which are connected to the positive output of power supply 500. The $\overline{Q}$ output of flip-flop 220 is connected to the anode of diode $D_7$, the cathode of which is connected to the clear input "Clr" of flip-flop 220. Resistor $R_{16}$ is connected parallel to diode $D_8$. A capacitor $C_7$ is grounded at one side, and connected at the other side to the clear input "Clr" of flip-flop 220. The $\overline{Q}$ output of flip-flop 220 is connected to the data input "D" of delay flip-flop 180 and to the cathode of diode $D_8$, the anode of which is connected to hold output 24.

An "autohold" flip-flop 240 has its clock input "C" connected to the $\overline{Q}$ output of timer flip-flop 200. Both the preset input "Pre" and the data input "D" of autohold flip-flop 240 are connected to the positive output of power supply 500. The $\overline{Q}$ output of flip-flop 240 is connected to the cathode of a diode $D_9$, the anode of which is connected to one contact of a single-pole single-throw switch $S_4$ used to activate the "autohold" circuit. The second contact of $S_4$ is connected to hold output terminal 24. The clear input "Clr" of flip-flop 240 is connected through resistor $R_{17}$ to the positive output of power supply 500. Also, the clear input "Clr" is connected to one contact of momentary contact reset switch $S_5$, the other side of which is grounded.

The Q output of timer flip-flop 200 is connected to the anode of a diode $D_{10}$, the cathode of which is connected to the gate of FET $Q_1$.

FIG. 3(b) shows a power supply 500 suitable for use with the circuit of FIG. 3(a). Preferably the power supply used will operate from a single 9 volt dry cell, so the unit will be wholly portable. Power supply 500 provides positive and negative outputs of ±4.5 volts.

Component values which have been found to be suitable for the circuit of FIG. 3(a) are provided in the following list:

| $R_1$ | 976.KΩ | $R_{10}$ | 22.MΩ |
|---|---|---|---|
| $R_2$ | 24.9KΩ | $R_{11}$ | 2.MΩ |
| $R_3$ | 1.KΩ | $R_{12}-R_{17}$ | 22.MΩ |

-continued

| $R_4$ | 249.KΩ | $R_{18}$ | 1.13MΩ |
|---|---|---|---|
| $R_5$ | 1.MΩ | $R_{19}$ | 11.5MΩ |
| $R_6$ | 88.MΩ | $R_{20}$ | 7.32MΩ |
| $R_7$ | 48.7KΩ | $R_{21}$ | 7.32Ω |
| $R_8$ | 22.MΩ | $R_{22}$ | 22.MΩ |
| $R_9$ | 1.MΩ | | |
| $C_1$ | .18μf | $C_7$ | .0056μf |
| $C_2$ | 470.pf | $C_8$ | .018μf |
| $C_3$ | .18μf | $C_9$ | .018μf |
| $C_4$ | .082μf | $C_{10}$ | 6.9μf |
| $C_5$ | .0047μf | $C_{11}$ | 6.8μf |
| $C_6$ | .0047μf | | |

$D_1-D_9$ 1N914 type
$A_1-A_4$ 776 type
$Q_1$ P 1087E p-channel FET

The circuit of FIG. 3(a) operates as follows. Unity gain amplifier $A_1$ provides current amplification for the attenuated input signal and applies it to capacitor $C_1$ through normally conducting FET $Q_1$ to charge capacitor $C_1$ to the signal voltage. Amplifier $A_2$ amplifies the signal on capacitor $C_1$ and applies it to output terminal 14. Resistances $R_1$, $R_2$, $R_4$ and $R_5$ are preselected so that the voltage at output 14 is attenuated by a factor of 10 from the input signal. This enables the track and hold system to operate on a wider range of signals while using a single 9 volt dry cell. Conveniently, resistors $R_{18}$ and $R_{19}$ are preselected so that the voltage at output 16 is attenuated by a factor of 1000 from the input signal, so that a millivolt scale can be used on an associated meter to provide full voltage readings.

The leading edge of a pulse at the output 60 of amplifier $A_2$ is detected by the AC pulse amplifier including trigger amplifier $A_3$. The design parameters, including amplification factor and the size of input capacitor $C_2$, taken in conjunction with the trigger threshold voltage of flip-flop 180 or 200, determine what input risetime characteristics constitute a pulse. The position of trigger polarity switch $S_2$ determines whether the AC amplifier incorporating amplifier $A_3$ will produce a positive output at the anode of diode $D_2$ for a positive input signal at amplifier $A_2$ or whether the positive $A_3$ output will be produced for a negative signal at amplifier $A_2$. Switch $S_2$ is manually selectable in the illustrated embodiment of the invention. Diode $D_2$ passes unipolar positive pulses to the clock input of flip-flop 180 or 200, depending on the position of $S_3$. Diode $D_2$ reduces the stress on the flip-flop by excluding negative pulses, and the diode drop maximizes the positive baseline conditions while maintaining proper circuit operation. The values given for this illustrative embodiment will produce an appropriate activation signal for a one volt input signal excursion at input 10 with a risetime faster than 2 milliseconds.

The operation of the delay timing circuit including flip-flop 180 proceeds as follows. Initially the clock input C is low and the data input D is high, the Q output and the clear input "Clr" are also high. When a positive pulse is applied to the clock input C, the flip-flop 180 stores the D value as Q so that Q becomes high and $\overline{Q}$ goes low. This condition presists even after the positive input at C has disappeared. When $\overline{Q}$ goes low, capacitor $C_3$ is gradually discharged through selectable resistance $R_{11}$. At some time the voltage applied to the clear input by capacitor $C_3$ causes Q to reset to the zero or low state and $\overline{Q}$ to change to the high state, and the circuit can then be retriggered. This time may be read from the scale surrounding the $R_{11}$ potentiometer shaft. Diode $D_3$ reduces the retrigger set up time by quickly charging $C_3$.

In the position shown in FIG. 3(a), by-pass switch $S_3$ connects the Q output of flip-flop 180 to the clock input "C" of timer flip-flop 200. The low to high return of the Q output of flip-flop 180 clocks flip-flop 200. Since "D" and "Pre" are both high, the Q output goes high and the $\bar{Q}$ output goes low. As a first consequence, FET $Q_1$ is turned off and disconnects capacitor $C_1$ from any new input signals. Thus, while the Q output of timer flip-flop 200 remains high the signal applied to output terminal 14 is determined by the potential stored on capacitor $C_1$ which is representative of the pulse amplitude after the delay period caused by delay flip-flop 180.

Also, when timer flip-flop 200 is clocked, the voltage rise at its Q output is coupled through capacitor $C_6$ and diode $D_6$ to clock hold flip-flop 220. Hence, the $\bar{Q}$ output of flip-flop 220 goes low, causing the normally high output at 24 to go low. The duration of this hold command is set by the discharge time of capacitor $C_7$ through resistor $R_{16}$, illustratively 200 milliseconds.

Flip-flop 200 functions like delay flip-flop 180 and after a time illustratively 1500 milliseconds the voltage applied to the clear input by capacitor $C_4$ causes its Q output thereof to return to low, and, correspondingly, its $\bar{Q}$ output to return to high. One consequence of this is the FET $Q_1$ will close (turn on), so that new input signals can pass to $C_1$. Another consequence is that the transition of $\bar{Q}$ from low to high causes point 90 to go high again. Since the $\bar{Q}$ output is coupled through capacitor $C_5$ and diode $D_5$ to the clock input of hold flip-flop 220, the voltage rise again clocks flip-flop 220. Hence, a second "hold" command for 200 milliseconds is applied to hold output 24, as described above.

The $\bar{Q}$ output of flip-flop 220 is connected to the "D" of flip-flop 180. If the data input D is held in the low state, the presence of a positive pulse at C does not cause the delay circuit to operate. Hence, flip-flop 180 is disabled for the duration of the hold command, so that timer flip-flop 200 cannot be clocked during that hold command. As a result, intermediate characteristics of pulses reaching trigger amplifier $A_3$ when the FET $Q_1$ is closed can not open the FET even if $A_3$ is triggered.

Finally, an autohold flip-flop 240 is engaged when switch $S_4$ is closed. The return of the $\bar{Q}$ output of timer flip-flop 200 from low to high will clock flip-flop 240, providing an open-end hold command at output 24 until switch $S_5$ is closed to ground the clear input.

It will be appreciated that the track and hold circuit of present invention achieves the aforementioned objectives and provides an extremely useful result. This track and hold circuit used in conjunction with a multimeter is fully capable of measuring pulse amplitude at any position on a pulse, as well as pulse duration. Moreover as a result of taking the trigger after the storage device, filtering against noise sources is achieved for reliable operation.

It will be apparent to those skilled in the art that various modifications of the present invention are possible. For example, modifications to the trigger amplifier can be made to accommodate a wide range of pulse recognition or level change conditions. The functions of the delay and timer circuits could be implemented by more conventional single shot multivibrator integrated circuits. However, the embodiment shown herein provides very low power consumption, an important feature for portable, battery-powered devices.

What is claimed is:
1. A track and hold circuit comprising:
input means for receiving an input signal;
a storage device for receiving a signal from said input means and for storing a signal corresponding to the amplitude of said input signal;
output means coupled to said storage device;
a pulse detector for detecting a leading edge of a pulse passing from said storage device to said output means;
a switch responsive to said detector for isolating said storage device from signals applied to said input means and
a delay circuit responsive to said detector for interposing a delay of selectable duration prior to switching said switch.
2. The system according to claim 1 further comprising a timer circuit responsive to said detector for activating said switch for a first predetermined period.
3. The system according to claim 1 wherein said storage device includes a non-polar capacitor.
4. The system according to claim 1 wherein said delay circuit includes
a D-type flip-flop,
a capacitor connected between the clear input of said flip-flop and a reference potential,
the side of said capacitor connected to said "clear" input being connected also to the Q output of said flip-flop, whereby after said flip-flop is clocked, said capacitor discharges to said reference and activates said clear input to reset said flip-flop.
5. The system according to claim 1 wherein said delay circuit includes a one shot multivibrator.
6. The system according to claim 2 further comprising a hold circuit responsive to said timer for providing hold commands to a "hold" output of said system, said hold command enduring for a second predetermined period when said switch opens and when said switch closes.
7. The system according to claim 6 wherein said hold circuit also communicates with said delay circuit to disable said delay circuit for a third predetermined period beginning with the end of said first predetermined period.
8. The system according to claim 1 further comprising switch means connected to said pulse detector for selecting the polarity of a leading edge to which said pulse detector responds.
9. The system according to claim 8 wherein said pulse detector includes an operational amplifier and wherein said polarity switch means connects said storage device to a selected one of the inverting and non-inverting inputs of said amplifier and connects a reference potential to the other one of said inputs.
10. The system according to claim 1 wherein said switch comprises a field effect transistor coupling said input means with said storage device, said transistor having a control gate, coupled to said pulse detector, for receiving signals for opening and closing said switch.
11. The system according to claim 1 wherein said pulse detector includes an AC pulse amplifier connected to receive signals from said output means and sensitive to the rate of change of said signals and operating to supply an activation signal to said delay circuit.
12. A circuit for providing signals to determine the amplitude and width of a pulse applied to its input comprising:

an input circuit;

storage means for storing a signal corresponding to the instantaneous value of the amplitude of the pulse applied to said input circuit;

means for detecting the leading edge of said pulse;

variable delay means for disconnecting said storage means from said input circuit a selected time after the detection of the leading edge of said pulse;

said storage means including means for retaining the value of the signal stored therein at the time of being disconnected from said input circuit; and means for varying the delay of such variable delay means for allowing measurement of the amplitude of the pulse at various points after a leading edge.

13. A circuit according to claim 12 wherein said storage means includes a buffer amplifier having a low output impedance and a capacitor coupled at one side to the output of said buffer amplifier and coupled at the other side to ground.

14. A circuit according to claim 13 further comprising an output amplifier having an input coupled to the ungrounded side of said capacitor and having an output coupled to an output terminal.

15. A circuit according to claim 14 including a voltage divider network coupled to a selected one of said input circuit and the output of said output amplifier for attenuating by a factor of 1,000 the signal at said output terminal from the signal applied to said input circuit.

16. A circuit according to claim 14 wherein said means for detecting the leading edge of said pulse includes an AC pulse amplifier having one grounded input and another input coupled to the output of said output amplifier, said pulse amplifier producing an activation signal in response to a predetermined risetime of a signal applied thereto.

* * * * *

UNITED STATES PATENT AND TRADEMARK OFFICE
CERTIFICATE OF CORRECTION

PATENT NO. : 4,150,310

DATED : April 17, 1979

INVENTOR(S) : Philip Emile, Jr.

It is certified that error appears in the above-identified patent and that said Letters Patent are hereby corrected as shown below:

Column 1, lines 19 and 20, "unkown" should read -- unknown --.

Column 1, line 27, "milliamper" should read -- milliampere --.

Column 3, line 29, "masuring" should read -- measuring --.

Column 4, line 49, "Q" should read -- $\overline{Q}$ --.

Column 5, line 16, "Q" should read -- $\overline{Q}$ --.

Column 5, line 33, "$D_8$" should read -- $D_7$ --.

Column 6, line 57, "Q" should read -- $\overline{Q}$ --.

Column 6, line 60, "Q" in the last instance should read -- $\overline{Q}$ --.

Column 6, line 62, "Q" should read -- $\overline{Q}$ --.

Column 6, line 66, "Q" should read -- $\overline{Q}$ --.

UNITED STATES PATENT AND TRADEMARK OFFICE
CERTIFICATE OF CORRECTION

PATENT NO. : 4,150,310
DATED : April 17, 1979
INVENTOR(S) : Philip Emile, Jr.

It is certified that error appears in the above-identified patent and that said Letters Patent are hereby corrected as shown below:

Column 7, line 5, "Q" should read -- $\bar{Q}$ --.

Column 7, line 7, "Q" should read -- $\bar{Q}$ --.

Column 7, line 9, "Q" should read -- $\bar{Q}$ --.

In the Claims:

Claim 4, column 8, line 28, "Q" should read -- $\bar{Q}$ --.

Signed and Sealed this

Thirty-first Day of August 1982

[SEAL]

Attest:

GERALD J. MOSSINGHOFF

Attesting Officer     Commissioner of Patents and Trademarks